US012757320B2

(12) United States Patent
Lee et al.

(10) Patent No.: US 12,757,320 B2
(45) Date of Patent: Oct. 6, 2026

(54) CIRCUIT BOARD

(71) Applicant: CHIPBOND TECHNOLOGY CORPORATION, Hsinchu (TW)

(72) Inventors: Shih-Chuan Lee, Kaohsiung City (TW); Ching-Chi Chan, Taichung City (TW); Tzu-Min Wu, Kaohsiung City (TW)

(73) Assignee: CHIPBOND TECHNOLOGY CORPORATION, Hsinchu (TW)

(*) Notice: Subject to any disclaimer, the term of this patent is extended or adjusted under 35 U.S.C. 154(b) by 189 days.

(21) Appl. No.: 18/678,028

(22) Filed: May 30, 2024

(65) Prior Publication Data

US 2025/0254791 A1 Aug. 7, 2025

(30) Foreign Application Priority Data

Feb. 6, 2024 (TW) ................................ 113104828

(51) Int. Cl.
*H05K 1/02* (2006.01)

(52) U.S. Cl.
CPC ......... *H05K 1/0281* (2013.01); *H05K 1/0253* (2013.01); *H05K 1/0296* (2013.01)

(58) Field of Classification Search
CPC .......... H05K 1/02; H05K 1/0281; H05K 3/28; H05K 1/0296; H05K 2201/10681; H05K 2203/0228
USPC .......................................................... 361/749
See application file for complete search history.

(56) References Cited

U.S. PATENT DOCUMENTS

2003/0043565 A1 3/2003 Juang
2008/0116546 A1* 5/2008 Bang .................... H10W 74/111 438/107
2008/0265745 A1 10/2008 Pan et al.
2023/0343916 A1 10/2023 Kong et al.

FOREIGN PATENT DOCUMENTS

JP 2022-517023 A 3/2022
KR 10-0814433 B1 3/2008
KR 10-2011-0044532 A 4/2011
KR 10-2023-0022798 A 2/2023
(Continued)

OTHER PUBLICATIONS

Japanese notice of allowance mailed Aug. 25, 2025 for Japanese patent application No. 2024-087273, 3 pages.
(Continued)

*Primary Examiner* — Tremesha W Burns
(74) *Attorney, Agent, or Firm* — Demian K. Jackson; Jackson IPG PLLC

(57) ABSTRACT

A circuit board includes a substrate, circuit lines and a protective layer. The circuit lines are arranged on the substrate, and each includes a first conductive section, a second conductive section and a third conductive section, the second conductive section is located between the first and third conductive sections. The first and third conductive sections are covered by the protective layer, and the second conductive portion and an outer lead of the first conductive section are not covered by the protective layer. The protective layer covering the third conductive section is provided to protect the second conductive section and the outer lead from scratch or compression.

13 Claims, 7 Drawing Sheets

(56) References Cited

FOREIGN PATENT DOCUMENTS

| | | |
|---|---|---|
| KR | 10-2525417 B1 | 4/2023 |
| TW | M627493 U | 5/2022 |
| TW | M656313 U | 6/2024 |

OTHER PUBLICATIONS

Korean office action mailed Jun. 12, 2025 for Korean patent application No. 10-2024-0070851, 8 pages.
Taiwanese office action mailed Oct. 24, 2024 for Taiwanese patent application No. 113104828, 4 pages.
Korean notice of allowance mailed Feb. 5, 2026 for Korean patent application No. 10-2025-0105790, 3 pages.
Korean office action mailed Mar. 3, 2026 for Korean patent application No. 10-2025-0105791, 8 pages.

* cited by examiner

CIRCUIT BOARD

CROSS-REFERENCE TO RELATED APPLICATIONS

This application claims priority to R.O.C Patent Application No. 113104828 filed Feb. 6, 2024, the disclosure of which is hereby incorporated by reference in its entirety.

FIELD OF THE INVENTION

This invention relates to a circuit board, and more particularly to a flexible circuit board having circuit lines which are protected from scratch or compression by foreign matter.

BACKGROUND OF THE INVENTION

Referring to FIG. 1, a conventional circuit tape T1 includes multiple units 10 each including a substrate 11, circuit lines 12 and a protective layer 13. Each of the circuit lines 12 has an inner lead 12*a*, an outer lead 12*b* and a test pad 12*c*, the outer lead 12*b* is located between the inner lead 12*a* and the test pad 12*c*. The protective layer 13 covers the circuit lines 12 except the inner lead 12*a*, the outer lead 12*b* and the test pad 12*c*.

During transporting or rolling up the circuit tape T1, the outer lead 12*b* and the test pad 12*c* which are not covered by the protective layer 13 may be scratched by foreign matter remained on the circuit tape T1 (not shown, e.g. metal particle/debris or ink particle/debris generated during manufacture processes), and they may be compressed to be deformed or generate whiskers to cause the unit 10 to be defective.

SUMMARY OF THE INVENTION

One object of the present invention is to provide a circuit board which can prevent foreign matter remained on the circuit board from scratching circuit lines and can protect the circuit lines from compression to generate whiskers.

A circuit board of the present invention includes a substrate, circuit lines and a protective layer. A first area, a second area and a third area are defined on a surface of the substrate, and the second area is located between the first and third areas in a first direction for transportation the circuit board. Each of the circuit lines includes a first conductive section arranged on the first area, a second conductive section arranged on the second area and a third conductive section arranged on the third area. The first conductive section has an inner lead and an outer lead. The second conductive section is located between the first and third conductive sections and is connected to the outer lead and the third conductive section. The first and third conductive sections are covered by the protective layer, and the second conductive section, the inner lead and the outer lead of the first conductive section are not covered by the protective layer.

Owing to the protective layer covering the third conductive section is higher than the circuit lines, the outer lead of the first conductive section and the second conductive section which are not covered by the protective layer are protected from scratch by foreign matter and protected from compression to generate whiskers.

DETAILED DESCRIPTION OF THE INVENTION

Figure 1:
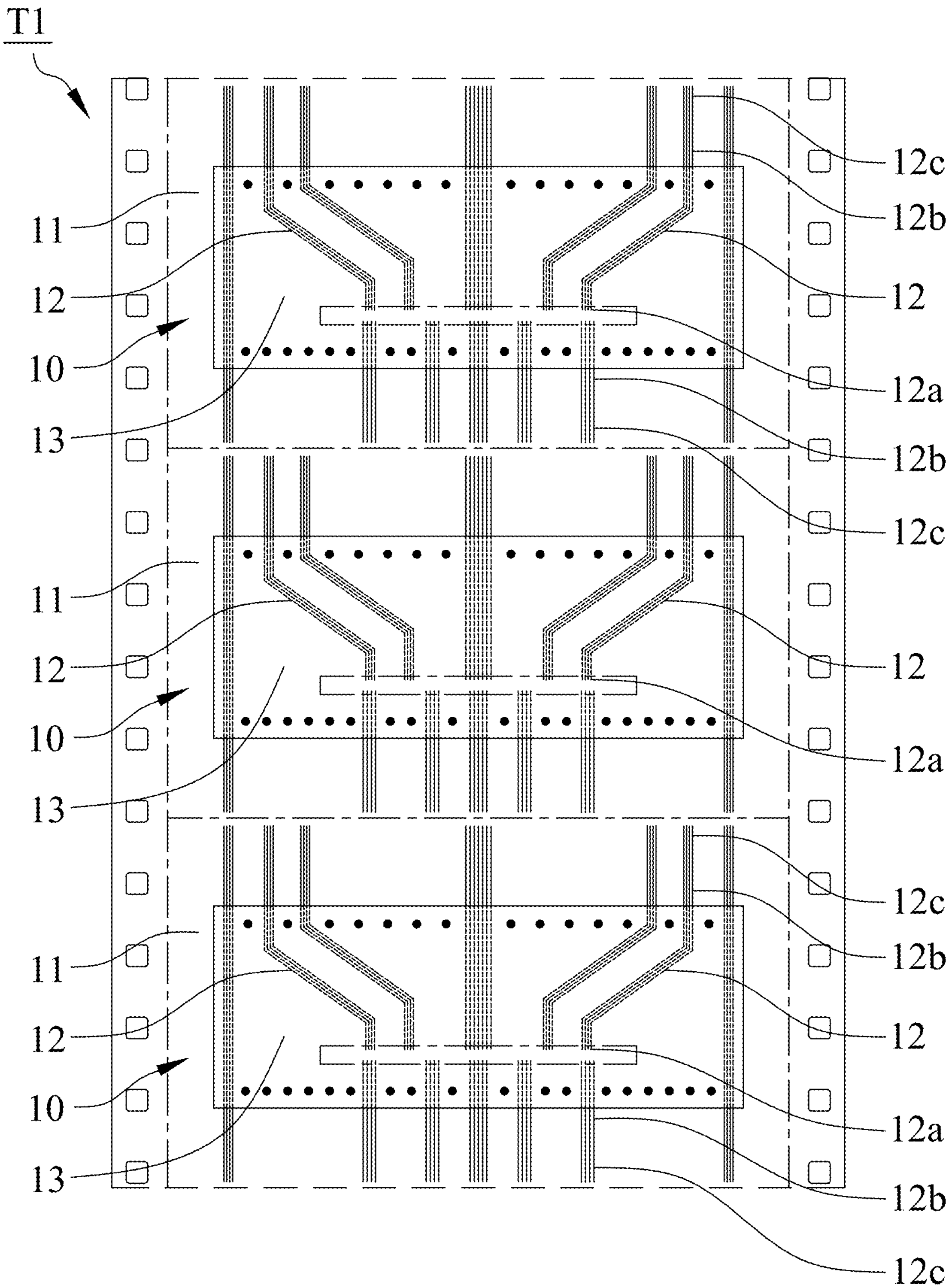
FIG. 1 PRIOR ART
FIG. 1 is top view diagram illustrating a conventional circuit tape.
Figure 2:
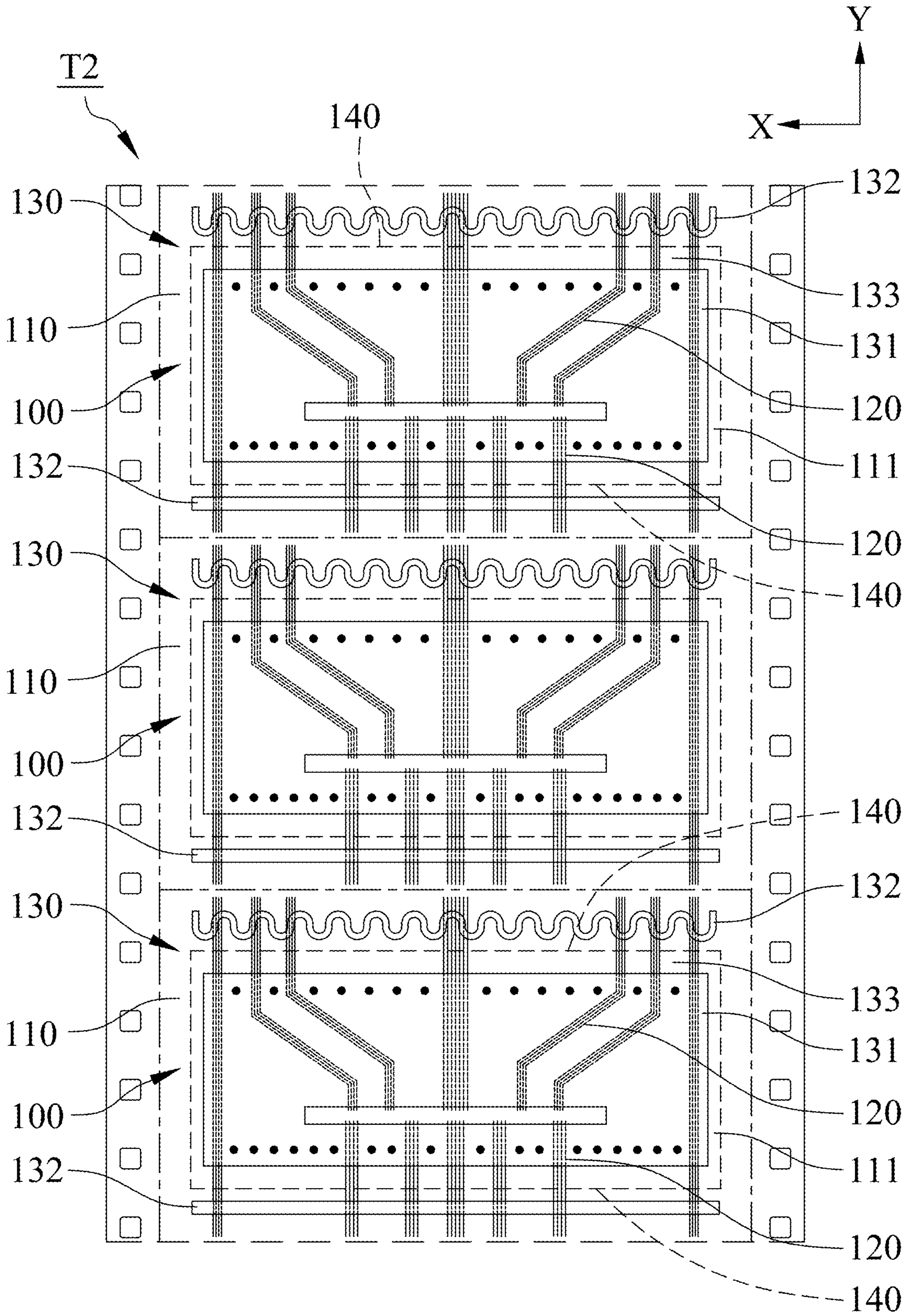
FIG. 2 is a top view diagram illustrating a circuit tape in accordance with one embodiment of the present invention.
Figure 3:
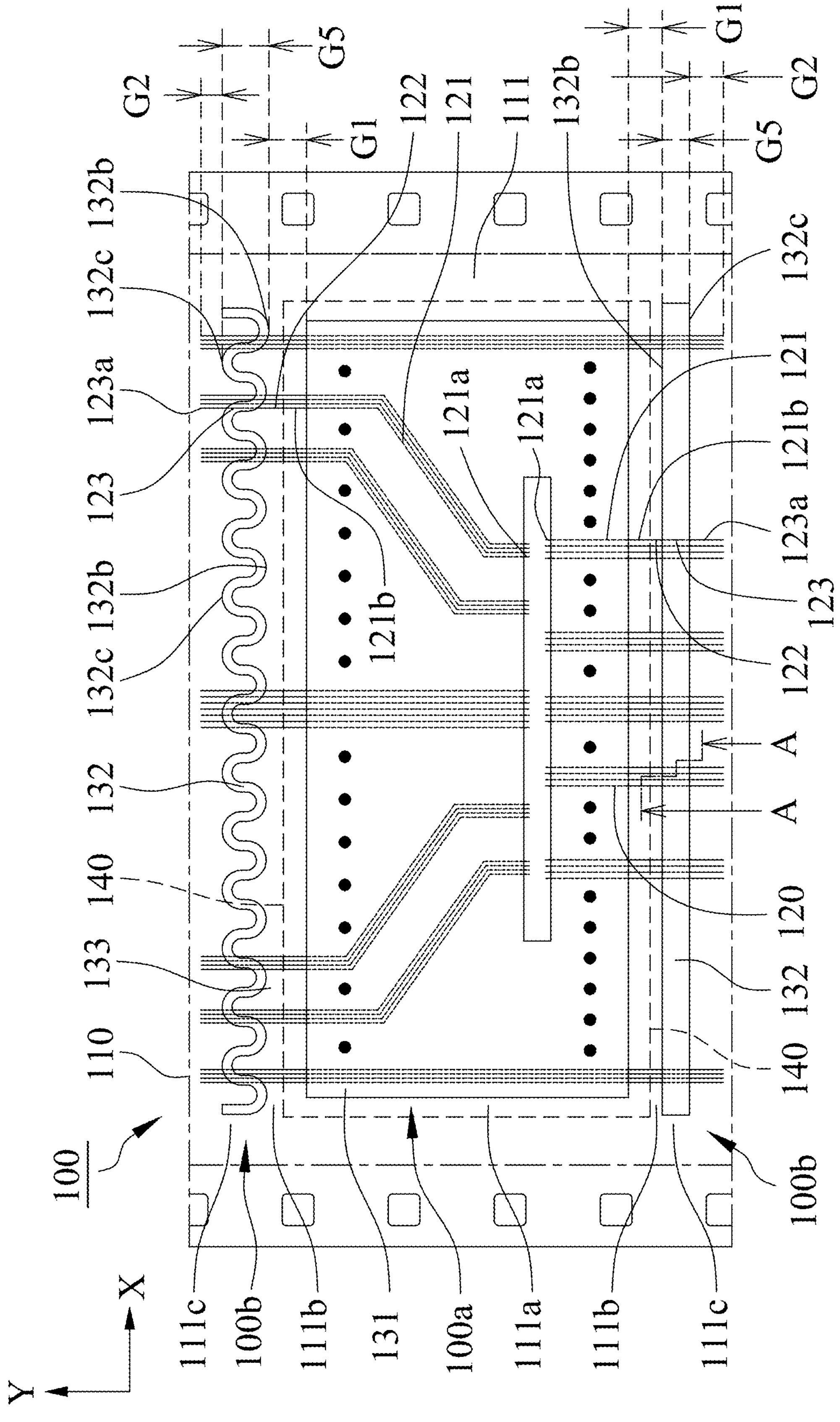
FIG. 3 is a top view diagram illustrating a circuit board in accordance with one embodiment of the present invention.

With reference to FIGS. 2 and 3, a circuit tape T2 includes a plurality of circuit boards 100 each including a substrate 110, circuit lines 120 and a protective layer 130. The substrate 110 can be made of polyimide (PI) or other suitable materials, and a first area 111*a*, a second area 111*b* and a second area 111*c* are defined on a surface 111 of the substrate 110. Along a first direction Y for transporting the circuit boards 100, the second area 111*b* is located between the first area 111*a* and the third area 111*c*.

Figure 5:
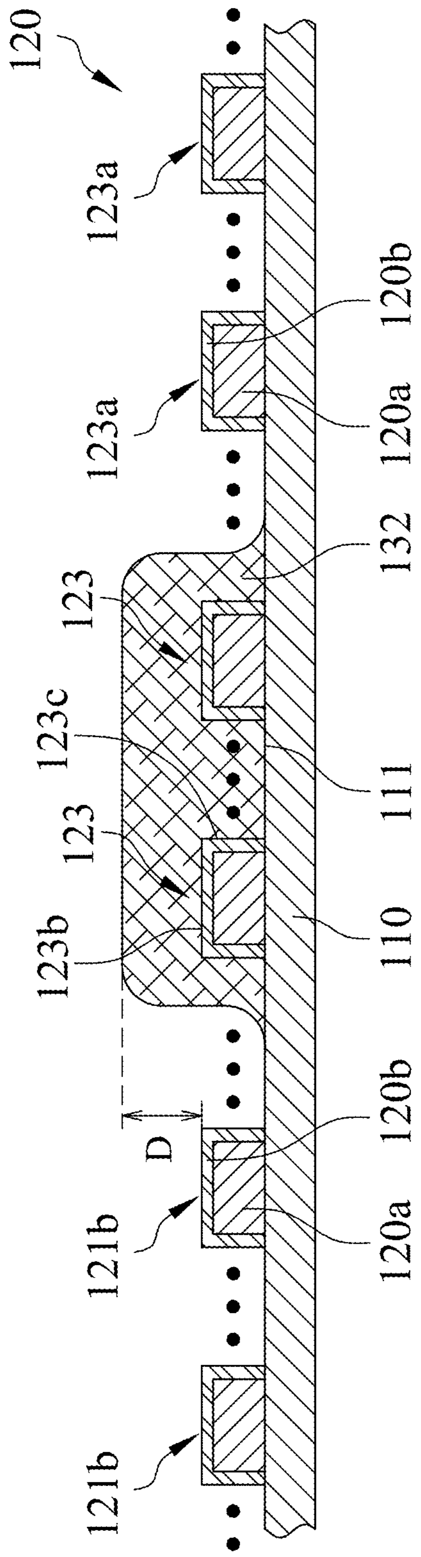
FIG. 5 is a cross-section view diagram along A-A line of FIG. 3.
Figure 6:
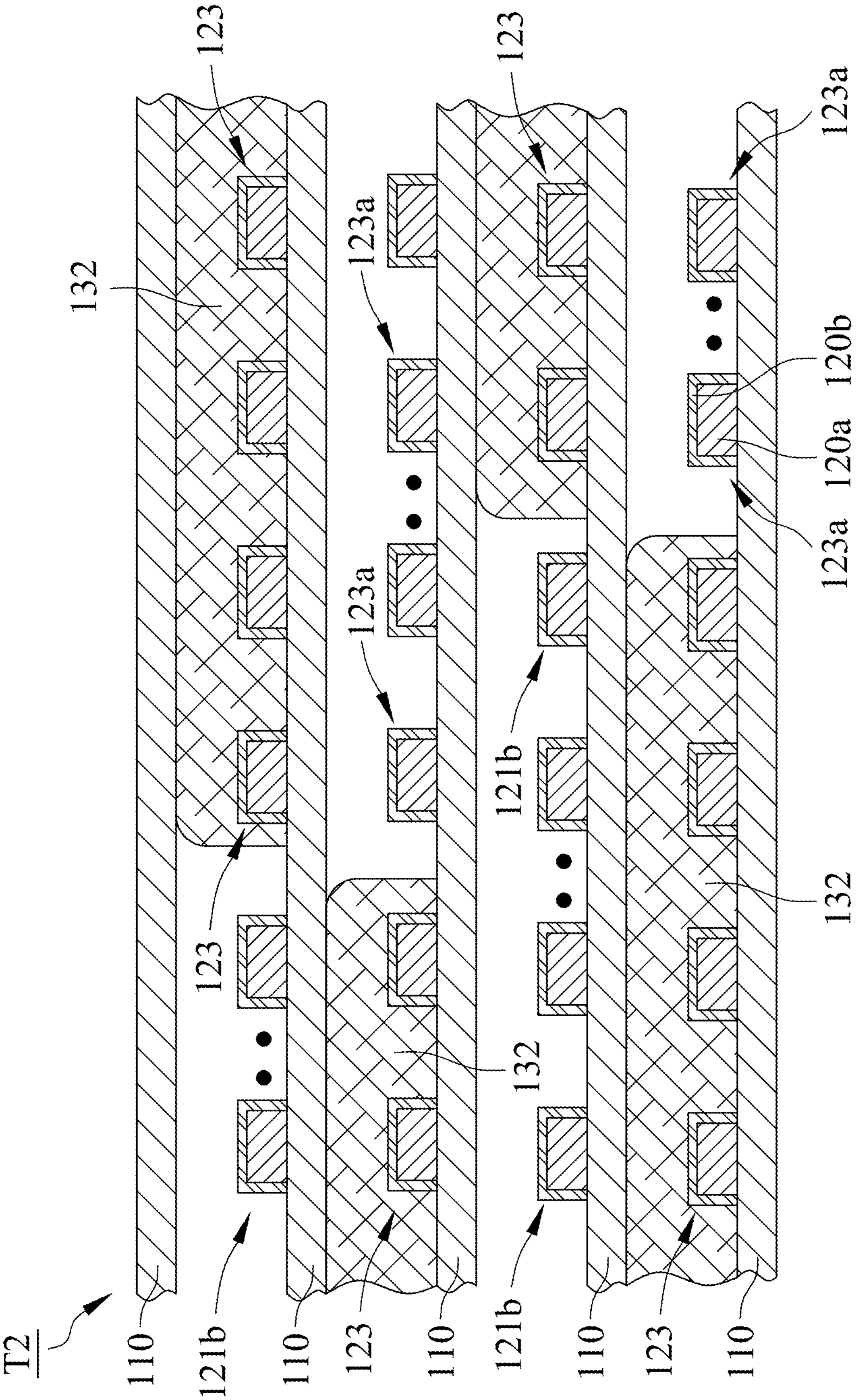
FIG. 6 is a cross-section view diagram illustrating a part of a circuit tape during rolling up in accordance with one embodiment of the present invention.

With reference to FIGS. 2, 3 and 5, the circuit lines 120 are arranged on the surface 111 of the substrate 110 and they can be made of copper or other suitable metal materials. In this embodiment, each of the circuit lines 120 has a copper layer 120*a* and a tin layer 120*b* which covers the copper layer 120*a*. Each of the circuit lines 120 includes a first conductive section 121 located on the first area 111*a*, a second conductive section 122 located on the second area 111*b* and a third conductive section 123 located on the third area 111*c*, the second conductive section 122 is located between the first conductive section 121 and the third conductive section 123. One end of the first conductive section 121 is an inner lead 121*a* provided for bonding an electronic element (not shown, e.g. a chip), the other end of the first conductive section 121 is an outer lead 121*b*. The second conductive section 122 is connected to the third conductive section 123 and the outer lead 121*b* of the first conductive section 121. In this embodiment, the third conductive section 123 has a test pad 123*a*.

With reference to FIGS. 2 and 3, the protective layer 130 covers the first conductive section 121 and the third conductive section 123 of each of the circuit lines 120, but not cover the second conductive section 122, the inner leads 121*a* and the outer lead 121*b* of the first conductive section 121 and the test pad 123*a* of the third conductive section 123. Preferably, the protective layer 130 can be made of a solder resist material.

Referring to FIGS. 2 and 3, the protective layer 130 has a first protective portion 131, at least one second protective portion 132 and a hollow portion 133 which is located between the first protective portion 131 and the second protective portion 132. In this embodiment, the protective layer 130 has two second protective portions 132, and the first protective portion 131 is located between the two second protective portions 132.

With reference to FIGS. 3 and 5, the first protective portion 131 covers the first conductive section 121 but not cover the inner lead 121*a* and the outer lead 121*b* of the first conductive section 121, the second protective portion 132 covers the third conductive section 123 but not cover the test pad 123*a* of the third conductive section 123. In this embodiment, the second protective portion 132 covers the tin layer 120*b* such that the tin layer 120*b* is located between the copper layer 120*a* and the second protective portion 132. The hollow portion 133 located between the first protective portion 131 and the second protective portion 132 is provided to expose the second conductive section 122 located between the first conductive section 121 and the third conductive section 123.

With reference to FIGS. 3 and 5, the second protective portion 132 covers a top surface 123*b* and a lateral surface 123*c* of the third conductive section 123 and covers the surface 111 of the substrate 110 where is located between the adjacent third conductive sections 123. A thickness D of the second protective portion 132 covering the top surface 123*b* of the third conductive section 123 is designed to be greater than or equal to 0.5 um and less than or equal to 50 um to allow the second protective portion 132 to be higher than the circuit lines 120.

As shown in FIG. 3, the outer lead 121*b* of the first conductive section 121, which is not covered by the first protective portion 131, is connected to the second conductive section 122 and visible from the hollow portion 133.

With reference to FIG. 3, a predetermined cutting line 140 is designed to run through the hollow portion 133 in a second direction X intersecting the first direction Y and be located between the first protective portion 131 and the second protective portion 132, and the outer lead 121*b* of the first conductive section 121 is located between the first protective portion 131 and the predetermined cutting line 140. In this embodiment, the first direction Y is vertical and the second direction X is horizontal, the predetermined cutting line 140 is designed to surround the first area 111*a* defined on the surface 111 of the substrate 110 to separate the circuit board 100 into a part 100*a* to be reserved and a part 100*b* to be removed. The first conductive section 121 and the first protective portion 131 covering the first conductive section 121 are arranged on the part 100*a* to be reserved. The second conductive section 122, the third conductive section 123 and the second protective portion 132 covering the third conductive section 123 are arranged on the part 100*b* to be removed. During cutting process, a cutting tool (not shown) is provided to cut the circuit board 100 along the predetermined cutting line 140 to divide the circuit board 100 into the part 100*a* to be reserved and the part 100*b* to be removed, and meanwhile, the first conductive section 121 and the second conductive section 122 of each of the circuit lines 120 are separated from each other, and the outer lead 121*b* of the first conductive section 121 is located on the part 100*a* to be reserved.

With reference to FIG. 3, a first distance G1 between the first protective portion 131 and the second protective portion 132 along the first direction Y is greater than or equal to 0.5 um and less than or equal to 2 um, and a second distance G2 between the second protective portion 132 and the test pad 123*a* of the second conductive section 123 along the first direction Y is greater than or equal to 0.5 um and less than or equal to 2 um.

Figure 4A:
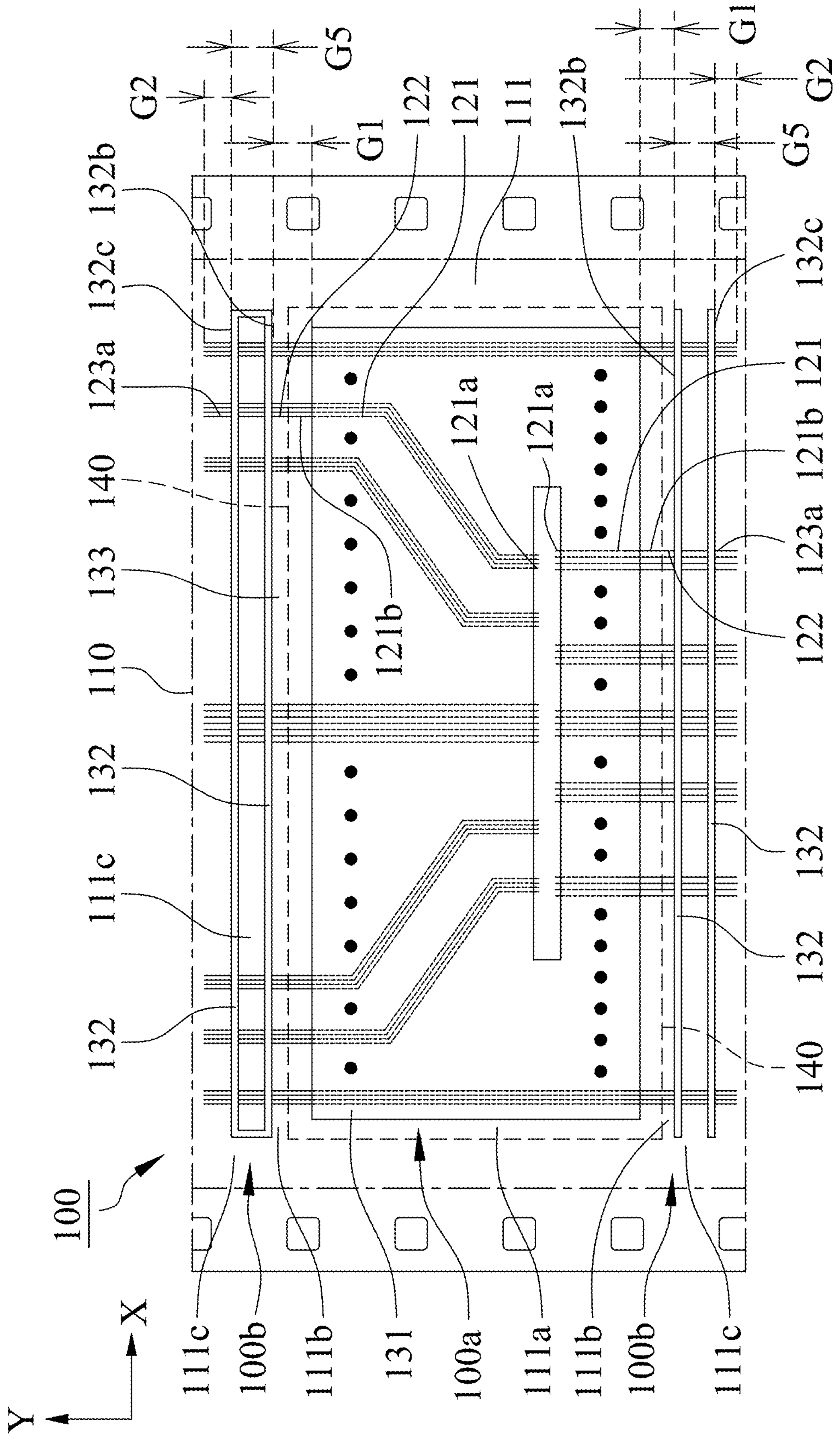
FIG. 4A is a top view diagram illustrating a circuit board in accordance with one embodiment of the present invention.
Figure 4B:
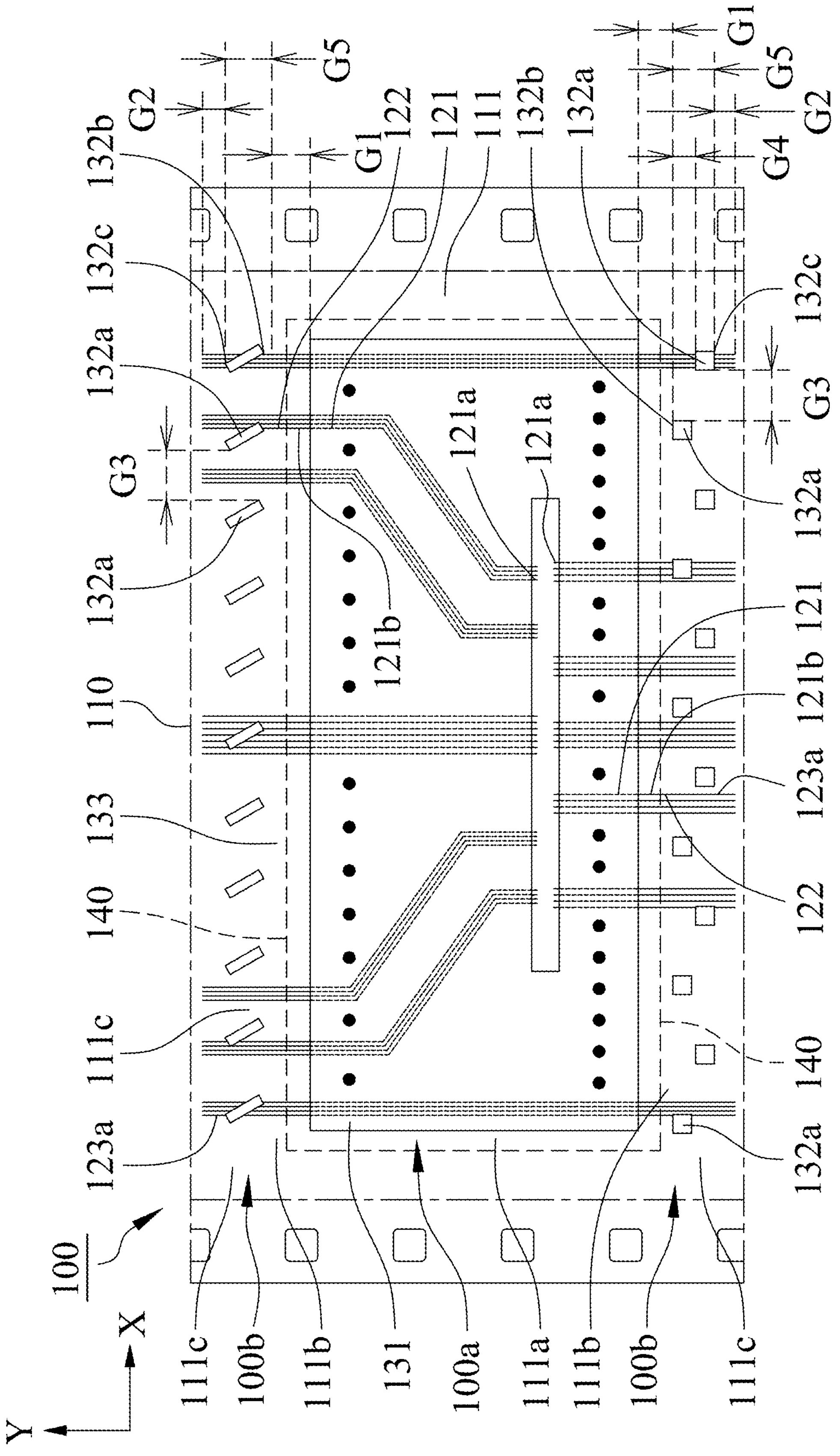
FIG. 4B is a top view diagram illustrating a circuit board in accordance with another embodiment of the present invention.

With reference to FIGS. 3 and 4A, the second protective portion 132 extends along the second direction X and has a continuous geometric form, e.g. linear, curved or square loop, regular or irregular geometric shape. In another embodiment as shown in FIG. 4B, the second protective portion 132 may have a non-continuous geometric form and involves multiple protrusions 132*a* which may be square, circular, regular or irregular geometric shape. A third distance G3 between the adjacent protrusions 132*a* along the second direction X is greater than or equal to 0.5 um and less than or equal to 158 mm. A fourth distance G4 between the adjacent protrusions 132*a* along the first direction Y is greater than or equal to 0.5 um and less than or equal to 50 mm. Referring to FIG. 3, the second protective portion 132 has a first edge 132*b* and a second edge 132*c*, and the first edge 132*b* is closer to the first protective portion 131 than the second edge 132*c* in the first direction Y. A fifth distance G5 from the first edge 132*b* to the second edge 132*c* is greater than or equal to 0.5 um and less than or equal to 50 mm.

With reference to FIGS. 2, 3, 5 and 6, the second protective portion 132 provided on the third area 111*c* and the third conductive section 123 is higher than the circuit lines 120 so it can prevent foreign matter (not shown, such as metal particle, metal debris, ink particle or ink debris generated during manufacture processes) from scratching the outer lead 121*b* of the first conductive section 121, the second conductive section 122 and the test pad 123*a* of the third conductive section 123 during transporting or rolling up the circuit tape T2. Moreover, the second protective portion 132 can prevent the outer lead 121*b* of the first conductive section 121, the second conductive section 122 and the test pad 123*a* of the third conductive section 123 from being compressed to generate whiskers.

While this invention has been particularly illustrated and described in detail with respect to the preferred embodiments thereof, it will be clearly understood by those skilled in the art that is not limited to the specific features shown and described and various modified and changed in form and details may be made without departing from the scope of the claims.

The invention claimed is:

1. A circuit board comprising:

a substrate having a surface, a first area, a second area, and a third area are defined on the surface, and the second area is located between the first and third areas in a first direction for transporting the circuit board;

a plurality of circuit lines, each including a first conductive section arranged on the first area, a second conductive section arranged on the second area, and a third conductive section arranged on the third area, the first conductive section includes an inner lead and an outer lead, the second conductive section is located between the first and third conductive sections, and both ends of the second conductive section are connected to the outer lead of the first conductive section and the third conductive section, respectively; and a protective layer configured to cover the first and third conductive sections, wherein the second conductive section, the inner lead and the outer lead of the first conductive section are not covered by the protective layer and wherein the protective layer includes a first protective portion, at least one second protective portion, and a hollow portion located between the first protective portion and the at least one second protective portion, the first protective portion is configured to cover the first conductive section, the inner lead and the outer lead of the first conductive section are not covered by the first protective portion, the at least one second protective portion is configured to cover the third conductive section, the hollow portion is configured to expose the outer lead of the first conductive section and the second conductive section, a predetermined cutting line is configured to run through the hollow portion and be located between the first protection portion and the at least one second protective portion to separate the circuit board into a part to be reserved and a part to be removed, the outer lead is located between the first protective portion and the predetermined cutting line, the first conductive section and the first protective portion covering the first conductive section are located on the part to be reserved, the second conductive section, the third conductive section, and the at least one second protective portion covering the third conductive section are located on the part to be removed.

2. The circuit board in accordance with claim 1, wherein a test pad of the third conductive section is not covered by the at least one second protective portion.

3. The circuit board in accordance with claim 1, wherein the protective layer includes two second protective portions, and the first protective portion is located between the two protective portions.

4. The circuit board in accordance with claim 1, wherein a first distance between the first protective portion and the at least one second protective portion along the first direction is greater than or equal to 0.5 μm and less than or equal to 2 μm.

5. The circuit board in accordance with claim 4, wherein a test pad of the third conductive section is not covered by the at least one second protective portion, a second distance between the at least one second protective portion and an end of the test pad along the first direction is greater than or equal to 0.5 μm and less than or equal to 2 μm.

6. The circuit board in accordance with claim 1, wherein the at least one second protective portion extends along a second direction intersecting the first direction.

7. The circuit board in accordance with claim 1, wherein the at least one second protective portion includes a plurality of protrusions, a third distance between the adjacent protrusions along a second direction intersecting the first direction is greater than or equal to 0.5 μm and less than or equal to 158 mm.

8. The circuit board in accordance with claim 7, wherein a fourth distance between the adjacent protrusions along the first direction is greater than or equal to 0.5 μm and less than or equal to 50 mm.

9. The circuit board in accordance with claim 1, wherein the at least one second protective portion includes a plurality of protrusions, and a fourth distance between the adjacent protrusions along the first direction is greater than or equal to 0.5 um and less than or equal to 50 mm.

10. The circuit board in accordance with claim 2, wherein the at least one second protective portion includes a plurality of protrusions, and a fourth distance between the adjacent protrusions along the first direction is greater than or equal to 0.5 μm and less than or equal to 50 mm.

11. The circuit board in accordance with claim 1, wherein a top surface and a lateral surface of the third conductive section are covered by the at least one second protective portion, the surface of the substrate where is between the third conductive sections of the adjacent circuit lines are covered by the at least one second protective portion, a thickness of the at least one second protective portion covering the top surface of the third conductive section is greater than or equal to 0.5 μm and less than or equal to 50 μm.

12. The circuit board in accordance with claim 11, wherein each of the plurality of circuit lines includes a copper layer and a tin layer which is located between the copper layer and the at least one second protective portion.

13. The circuit board in accordance with claim 1, wherein a first edge of the at least one second protective portion is closer to the first protective portion than a second edge of the at least one second protective portion, a fifth distance from the first edge to the second edge is greater than or equal to 0.5 μm and less than or equal to 50 mm.

* * * * *